US009078365B2

(12) United States Patent
Morita et al.

(10) Patent No.: US 9,078,365 B2
(45) Date of Patent: Jul. 7, 2015

(54) RESIN COMPOSITION, PREPREG, LAMINATE, AND WIRING BOARD

(75) Inventors: Koji Morita, Chikusei (JP); Shin Takanezawa, Chikusei (JP); Kazunaga Sakai, Chikusei (JP); Yuusuke Kondou, Chikusei (JP)

(73) Assignee: HITACHI CHEMICAL CO., LTD., Tokyo (JP)

( * ) Notice: Subject to any disclaimer, the term of this patent is extended or adjusted under 35 U.S.C. 154(b) by 694 days.

(21) Appl. No.: 12/298,168

(22) PCT Filed: Apr. 26, 2007

(86) PCT No.: PCT/JP2007/059022
§ 371 (c)(1),
(2), (4) Date: Oct. 23, 2008

(87) PCT Pub. No.: WO2007/125979
PCT Pub. Date: Nov. 8, 2007

(65) Prior Publication Data
US 2009/0200071 A1 Aug. 13, 2009

(30) Foreign Application Priority Data
Apr. 28, 2006 (JP) .................................. 2006-125603

(51) Int. Cl.
C08L 71/12 (2006.01)
C08G 59/26 (2006.01)
H05K 1/03 (2006.01)
C08J 5/24 (2006.01)

(52) U.S. Cl.
CPC .............. *H05K 1/0326* (2013.01); *C08G 59/26* (2013.01); *C08J 5/24* (2013.01); *H05K 2201/068* (2013.01)

(58) Field of Classification Search
CPC ........... H05K 1/0326; H05K 2201/068; C08G 59/245; C08L 71/12
USPC ......... 174/258; 442/59; 427/386; 528/97, 87, 528/98
See application file for complete search history.

(56) References Cited

U.S. PATENT DOCUMENTS

| 5,519,177 A * | 5/1996 | Wang et al. ................... 174/259 |
| 2004/0247882 A1* | 12/2004 | Kouchi et al. ................. 428/413 |
| 2008/0097010 A1* | 4/2008 | Kuroda .......................... 523/451 |

FOREIGN PATENT DOCUMENTS

| JP | 05-140266 | 6/1993 |
| JP | 05-222153 | 8/1993 |
| JP | 05-301941 | 11/1993 |
| JP | 06-136091 | 5/1994 |
| JP | 06-298967 | 10/1994 |
| JP | 07-316267 | 12/1995 |
| JP | 2740990 | 1/1998 |
| JP | 2000-114727 | 4/2000 |
| JP | 2000-243864 | 9/2000 |
| JP | 2001-049080 | 2/2001 |
| JP | 2001-302761 | 10/2001 |
| JP | 2002-226555 | 8/2002 |
| JP | 2004-059792 | 2/2004 |
| JP | 2004-182851 | 7/2004 |
| JP | 2004-250470 | 9/2004 |
| JP | 2004-256571 | 9/2004 |
| JP | 2005-082624 | 3/2005 |
| JP | 2005-097473 | 4/2005 |
| JP | 2005-154727 | 6/2005 |
| JP | 2005-255813 | 9/2005 |
| JP | 2005-281513 | 10/2005 |
| JP | 2005-325203 | 11/2005 |
| JP | 2005-330482 | 12/2005 |
| JP | 2006-249144 | 9/2006 |
| JP | 2007-291368 | 11/2007 |
| WO | WO 2006009147 A1 * | 1/2006 ............... H01L 23/29 |

OTHER PUBLICATIONS

Machine Translation of JP 2005-082624 (2011).*
Machine Translation of JP 2005-255813.*
Transmittal of Translation of the International Preliminary Report on Patentability mailed Nov. 27, 2008, for Application No. PCT/JP2007/059022.
Japanese Official Action dated Sep. 16, 2008, for Application No. 2008-204305.
Japanese Official Action dated Sep. 16, 2008, for Application No. 2007-116605.
Japanese Official Action dated Sep. 16, 2008, for Application No. 2008-204303.
Information submitted Jan. 30, 2009, provided by third parties for Application No. 2007-116605.
Japanese Official Action dated Feb. 12, 2013, for JP Application No. 2009-160940.
Japanese Official Action dated Mar. 19, 2013, for JP Application No. 2008-204304.
Japanese Official Action dated Aug. 27, 2013, for JP Application No. 2012-233864.

* cited by examiner

*Primary Examiner* — Mark Kaucher
(74) *Attorney, Agent, or Firm* — Fitch Even Tabin & Flannery

(57) ABSTRACT

Disclosed is a resin composition which is advantageous not only in that the resin composition can be produced at low cost, but also in that it is unlikely to thermally expand, and a prepreg, a laminate, and a wiring board formed using the resin composition. The resin composition comprises an insulating resin having an aromatic ring, wherein the insulating resin having an aromatic ring has a molecular weight between crosslinking sites of 300 to 1,000 on the stage after the production of the laminate, as determined from an elastic shear modulus of the insulating resin measured at a temperature of Tg or higher.

11 Claims, No Drawings

RESIN COMPOSITION, PREPREG, LAMINATE, AND WIRING BOARD

FIELD OF THE INVENTION

The present invention relates to a resin composition, a prepreg, a laminate, and a wiring board.

BACKGROUND ART

Recently, as electronic devices are miniaturized and further improved in performance, printed wiring boards having a wiring pitch narrowed, i.e., high-density wiring are desired. As a method of mounting a semiconductor for achieving high-density wiring, instead of the conventional wire bonding method, a flip chip bonding method is widely used. The flip chip bonding method is a method in which a wiring board and a semiconductor are bonded together using a solder ball instead of a wire. A solder ball is disposed between a wiring board and a semiconductor opposite to each other, and the whole of them are heated to cause reflow of the solder (melt bonding), thus bonding and mounting the semiconductor onto the wiring board. In this method, heat at approximately 300° C. is applied to the wiring board and others during the solder reflow. In this instance, the wiring board formed using a conventional resin composition as a material possibly suffers heat shrinkage to apply large stresses to the solder ball bonding the wiring board and semiconductor, causing a bonding failure of the wiring.

[Patent document 1] Japanese Unexamined Patent Publication No. 2004-182851
[Patent document 2] Japanese Patent No. 2740990
[Patent document 3] Japanese Unexamined Patent Publication No. 2000-243864
[Patent document 4] Japanese Unexamined Patent Publication No. 2000-114727

DISCLOSURE OF THE INVENTION

Problems to be Solved by the Invention

In view of the above, a laminate having a low thermal expansion coefficient is desired. Conventionally, a typical laminate comprises a resin composition comprising an epoxy resin as a chief material, and glass woven fabric, which are cured and integrally molded. An epoxy resin has excellent balance between the insulation properties, heat resistance, and cost, but it has a large thermal expansion coefficient. Therefore, generally, inorganic filler, such as silica, is added to the epoxy resin to suppress thermal expansion of the resin (see patent document 1). By adding an increased amount of the inorganic filler to the epoxy resin, thermal expansion of the resin can be further suppressed. However, it is known that the increase of the amount of the inorganic filler added to the resin causes a lowering of the insulation reliability due to moisture absorption, poor adhesion between the resin and wiring layers, or a failure of press molding. For this reason, in the application of multilayer wiring board, the increase in the amount of the inorganic filler added to the resin is limited.

An attempt is made to appropriately select or improve the resin to achieve low thermal expansion. For example, a low thermal-expansion resin composition for pressure molding using an epoxy resin having a difunctional naphthalene skeleton or a biphenyl skeleton (patent document 2) as an example of a known epoxy resin having an aromatic ring contains filler in an amount of 80 to 92.5 vol %. Further, conventionally, for reducing the resin composition for wiring board in thermal expansion coefficient, as described in patent documents 3 and 4, a method is generally employed in which the crosslinking density is increased, that is, the molecular weight between crosslinking sites in the present invention is reduced to increase the Tg, thus lowering the thermal expansion coefficient of the resin composition. For increasing the crosslinking density, namely, for reducing the molecular weight between crosslinking sites, the molecular chain between functional groups is shortened. However, the molecular chain is impossible to shorten less than a certain length if required reactivity or resin strength should be achieved. Therefore, the reduction of thermal expansion coefficient by a method of increasing the crosslinking density has a limitation.

As a resin unlikely to thermally expand, polyimide is widely known, but polyimide has problems in that the molding of polyimide requires high temperatures and in that polyimide is expensive. Polyimide is in the form of a film and hence suitable for a material for flexible substrate, but it is unsuitable for the application of multilayer wiring board which requires rigidity.

It is an object of the present invention to provide a resin composition which is advantageous not only in that the resin composition can be produced at low cost, but also in that it is unlikely to thermally expand, and a prepreg, a laminate, and a wiring board thereof.

Means to Solve the Problems

The present invention has the following embodiments.

A resin composition for use in production of a laminate, the resin composition comprising an insulating resin having an aromatic ring, wherein the insulating resin having an aromatic ring has a molecular weight between crosslinking sites of 300 to 1,000 on the stage after the production of the laminate, as determined from an elastic shear modulus of the insulating resin measured at a temperature of Tg or higher.

The resin composition, wherein the insulating resin having an aromatic ring comprises a polycyclic compound.

The resin composition, wherein the insulating resin has a biphenyl structure, a naphthalene structure, an anthracene structure, or a dihydroanthracene structure.

The resin composition, wherein the insulating resin is an epoxy resin.

The resin composition, wherein the epoxy resin comprises at least one crystalline epoxy resin.

The resin composition according to any one of claims 1 to 5, wherein the epoxy resin comprises at least one member selected from a biphenyl novolak epoxy resin represented by the following general formula (1):

General formula (1)

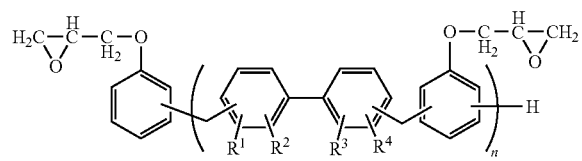

wherein each of $R^1$ to $R^4$ independently represents a $C_mH_{2m+1}$ group wherein m represents 0 or an integer of 1 or more, and n represents 0 or an integer of 1 or more, an anthracene epoxy resin represented by the following general formula (2):

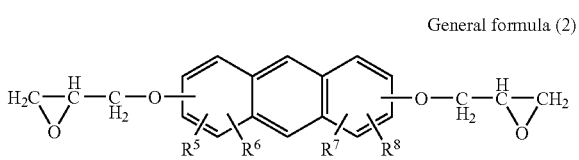

General formula (2)

wherein each of $R^5$ to $R^8$ independently represents a $C_pH_{2p+1}$ group wherein p represents 0 or an integer of 1 or more,
and a dihydroanthracene epoxy resin represented by the following general formula (3):

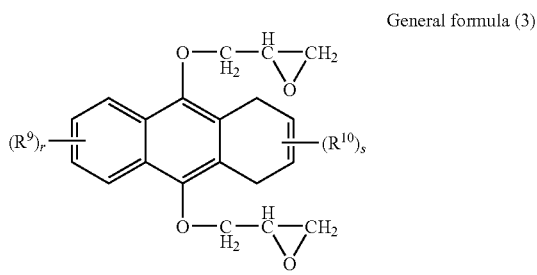

General formula (3)

wherein $R^9$ each occurrence independently represents a $C_tH_{2t+1}$ group (wherein t represents 0 or an integer of 1 or more), r represents an integer of 0 to 4, $R^{10}$ each occurrence independently represents a $C_uH_{2u+1}$ group (wherein u represents 0 or an integer of 1 or more), and s represents an integer of 0 to 6.

The resin composition, wherein the epoxy resin uses a curing agent which comprises at least one member selected from a phenolic novolak resin, a cresol novolak resin, a bisphenol A novolak resin, an aminotriazine novolak resin, a bismaleimide-containing aminotriazine novolak resin, dicyandiamide, and benzoguanamine.

A prepreg obtained by applying the resin composition to a substrate so that the substrate is impregnated with the resin composition, and then drying them.

The prepreg, wherein the substrate is glass woven fabric, glass nonwoven fabric, or aramid nonwoven fabric.

A laminate obtained by subjecting the prepreg of the present invention to laminate molding.

A wiring board obtained by subjecting the laminate of the present invention to circuit processing.

Effect of the Invention

Unlike a conventional method in which the crosslinking density is increased, by appropriately controlling the resin formulation in crosslinking density so that the resin having an aromatic ring has a molecular weight between crosslinking sites of 300 to 1,000, there can be provided a resin composition which is advantageous not only in that the resin composition can be produced at low cost, but also in that it has a low thermal expansion coefficient, and a prepreg, a laminate, and a wiring board thereof.

BEST MODE FOR CARRYING OUT THE INVENTION

The present inventors have made studies. As a result, it has unexpectedly been found that a conventional method of increasing the crosslinking density, namely, reducing the molecular weight between crosslinking sites in the present invention is not effective in lowering the thermal expansion coefficient. The present inventors have further made extensive and intensive studies. As a result, it has unexpectedly been found that controlling the resin formulation so that the resin having an aromatic ring has a crosslinking density corresponding to a molecular weight between crosslinking sites in the range of from 300 to 1,000 is very effective in lowering the thermal expansion coefficient. The resin composition of the present invention is used in production of a laminate, and comprises an insulating resin having an aromatic ring. The insulating resin having an aromatic ring used in the present invention has a molecular weight between crosslinking sites of 300 to 1,000 on the stage after the production of the laminate, as determined from an elastic shear modulus measured at a temperature of Tg or higher. When the insulating resin has a molecular weight between crosslinking sites of 300 to 1,000, strong interaction between aromatic rings can be achieved, making it possible to obtain a resin composition and a material for multilayer wiring board (prepreg or laminate) having a low thermal expansion coefficient. When the molecular weight between crosslinking sites is 300 or less, a material having an aromatic ring and having a small number of functional groups (exclusive of a monofunctional material) can be added to achieve a molecular weight between crosslinking sites of 300 or more. The addition of a material having a large functional group equivalent is effective. In this case, it is preferred that the aromatic ring contains a polycyclic compound, further preferably has a biphenyl structure, a naphthalene structure, an anthracene structure, or a dihydroanthracene structure. On the other hand, when the molecular weight between crosslinking sites is 1,000 or more, a material having an aromatic ring and having a large number of functional groups can be added to achieve a molecular weight between crosslinking sites of 1,000 or less. The addition of a material having a small functional group equivalent is effective. Also in this case, it is preferred that the aromatic ring contains the above polycyclic compound. The stage after the production of the laminate means a stage after the heat experience step in, for example, the production of the laminate or production of a multilayer wiring board or the like using the laminate. An elastic shear modulus of the insulating resin is generally measured by a dynamic viscoelasticity apparatus.

The molecular weight between crosslinking sites as determined from an elastic shear modulus measured by a dynamic viscoelasticity apparatus at a temperature of Tg or higher is described in, for example, Dynamic properties of polymers and composite materials (author: L. E. Nielsen; translator: Shigeharu Onoki) published by Kagaku-Dojin Publishing Company, Inc., and a molecular weight between crosslinking sites is determined from the descriptions of this book. Specifically, $$\log G \approx 7.0 + 293\rho/Mc \text{ (G: elastic shear modulus; } \rho\text{: density of a material; Mc: molecular weight between crosslinking sites)} \quad \text{Formula (1)}$$

is calculated using an empirical formula consistent with the experimental results. In this formula, dyn is used as a unit of elastic shear modulus.

G (elastic shear modulus) in the formula (1) above is generally determined by applying a value of storage modulus E at a temperature of Tg or higher calculated from a dynamic viscoelasticity apparatus to the following formula (2).

$$E = 2G(1+\sigma) \text{ (}\sigma\text{:Poisson ratio)} \quad \text{Formula (2)}$$

The dynamic viscoelasticity measurement apparatus generally measures dynamic viscoelasticity by applying sinusoidal wave vibration or composite wave vibration to a specimen in the elongation, compression, bending, or shear direction by a non-resonant forced vibration method. As an example of a commercially available apparatus, there can be mentioned Rheosol-E-4000, manufactured by UBM Co., Ltd. A method for the measurement is such that sinusoidal wave or composite wave vibration is applied to a specimen placed in a thermostatic chamber at set frequency and amplitude and the resultant stress response is detected by a detector to determine a storage modulus or the like by calculation from a measurement operation formula.

The insulating resin having an aromatic ring has a molecular weight between crosslinking sites of 300 to 1,000, preferably 310 to 900, further preferably 310 to 800, as determined from an elastic shear modulus measured by the above-mentioned measurement apparatus at a temperature of Tg or higher. When the molecular weight between crosslinking sites is less than 300, the interaction between aromatic rings is so weak that the thermal expansion coefficient of the resin cannot be satisfactorily reduced. On the other hand, when the molecular weight between crosslinking sites is more than 1,000, the interaction between aromatic rings is obtained, but the crosslinking density of the resin is reduced, so that the thermal expansion coefficient of the resin cannot be satisfactorily reduced.

With respect to the insulating resin used in the present invention, there is no particular limitation as long as the insulating resin has an aromatic ring, but an epoxy resin having excellent insulation properties and moisture absorption is preferably used in the application of multilayer wiring board. With respect to the epoxy resin used in the present invention, there is no particular limitation as long as the epoxy resin is a compound having two or more epoxy groups in the molecule thereof. Examples include naphthalene epoxy resins (particularly difunctional naphthalene epoxy resins), anthracene epoxy resins, dihydroanthracene epoxy resins, biphenyl epoxy resins, bisphenol A epoxy resins, bisphenol F epoxy resins, bisphenol S epoxy resins, biphenyl novolak epoxy resins, phenolic novolak epoxy resins, and cresol novolak epoxy resins. Among these, the crystalline epoxy resin is a highly crystalline epoxy resin which is a thermosetting epoxy resin having properties such that the high molecular chains are orderly arranged at a temperature under its melting point. And the resin in molten state exhibits a viscosity as low as that of a liquid resin although it is a solid resin. Examples of crystalline epoxy resins include naphthalene epoxy resins, anthracene epoxy resins, dihydroanthracene epoxy resins, biphenyl novolak epoxy resins, and biphenyl epoxy resins, and the crystalline epoxy resin is preferably used for enhancing the interaction between aromatic rings. These compounds may have any molecular weight, and can be used in combination.

In the resin composition of the present invention, when an epoxy resin is used, it is preferred that the resin composition contains a curing agent. With respect to the curing agent, there is no particular limitation as long as it has a curing action for epoxy resin, and examples include various amines, acid anhydrides, and novolak resins. Of these, especially preferred are a phenolic novolak resin, a cresol novolak resin, a bisphenol A novolak resin, an aminotriazine novolak resin, a bismaleimide-containing aminotriazine novolak resin, dicyandiamide, and benzoguanamine, and these can be used individually or in combination.

In the resin composition of the present invention, a curing accelerator can be used. With respect to the curing accelerator, there is no particular limitation as long as it has a curing acceleration action. When an epoxy resin is used, examples of curing accelerators include latent imidazole and imidazole derivatives, a BF3 amine complex, triphenylphosphine, 1,8-diazabicyclo-(5.4.0)undecene-7, ethyltriphenylphosphonium bromide, and tetramethylammonium chloride, and especially preferred examples include imidazole and imidazole derivatives.

In mixing the resin composition of the present invention, it is preferred that a solvent is added to the resin composition. With respect to the solvent, there is no particular limitation as long as the solvent has properties such that the insulating resin, a curing agent for a curing reaction of the insulating resin, and others are dissolved in and mixed into the solvent. With respect to the solvent, preferred is acetone, methyl ethyl ketone, methyl butyl ketone, toluene, xylene, ethyl acetate, N,N-dimethylformamide, N,N-dimethylacetamide, ethanol, ethylene glycol monomethyl ether, propylene glycol monomethyl ether, propylene glycol monomethyl ether acetate, cyclohexanone, or cyclopentanone since they have excellent dissolving power for the resin composition and a relatively low boiling point. With respect to the amount of the solvent added, there is no particular limitation as long as the insulating resin can be dissolved in the solvent, but the amount of the solvent is preferably in the range of from 20 to 300 parts by weight, further preferably 30 to 200 parts by weight, relative to 100 parts by weight of the sum of the insulating resin and the curing agent. The above solvents can be used in combination.

In the resin composition, inorganic filler can be used. With respect to the inorganic filler, silica, alumina, aluminum hydroxide, calcium carbonate, clay, talc, silicon nitride, boron nitride, titanium oxide, barium titanate, lead titanate, or strontium titanate can be used. For obtaining the material for multilayer wiring board (prepreg or laminate) of the present invention having uniform and excellent handling properties, the amount of the inorganic filler added is preferably 300 parts by weight or less, further preferably 250 parts by weight or less, relative to 100 parts by weight of the sum of the insulating resin and the curing agent in the resin composition of the present invention. When inorganic filler is added to the resin composition, for uniformly dispersing the filler in the composition, a mixer, a homogenizer, or the like is advantageously used.

In the resin composition of the present invention, an additive can be further used in such an amount that the effect aimed at by the present invention can be obtained. With respect to the additive, a silane coupling agent, a defoamer, or the like can be used. For maintaining excellent properties of the resin composition, the amount of the additive used is preferably 5 parts by weight or less, further preferably 3 parts by weight or less, relative to 100 parts by weight of the sum of the insulating resin and the curing agent.

Generally, when inorganic filler is added to the insulating resin, the resultant resin composition has an elastic modulus increased due to the elastic modulus of the inorganic filler, and hence has a molecular weight between crosslinking sites apparently smaller than the molecular weight between crosslinking sites of the single insulating resin. Therefore, it is preferred that an elastic modulus of the insulating resin is measured in a state such that the inorganic filler is removed and a molecular weight between crosslinking sites is determined by making a calculation, but, when the inorganic filler cannot be removed, the elastic modulus is corrected using the formula (3) below and a molecular weight between crosslinking sites calculated using the formula (1) and formula (2) above can be used as the molecular weight between crosslinking sites in the present invention. In the correction of elastic modulus using the formula (3), Pa is used as a unit of elastic modulus, and the unit is corrected to dyn in the formula (1), and, with respect to the Poisson ratio and specific gravity in the formula (2), respective values for the single resin must be used. When these values cannot be actually measured, a Poisson ratio of 0.5 and a specific gravity of 1.2 are applied to the formula to make a calculation.

$$Eb=Ea-(0.065\times Vf\times Vf+0.023\times Vf+0.001)\times Vf\times Ef/8 \quad \text{Formula (3)}$$

(Vf: volume percentage of inorganic filler; Ea: storage modulus measured in a state such that inorganic filler is incorporated; Eb: corrected storage modulus; Ef: elastic modulus of inorganic filler)

The prepreg of the present invention is obtained by applying the above-described resin composition to a substrate and drying them. The laminate of the present invention is obtained by subjecting the prepreg to laminate molding. With respect to the conditions for laminate molding, there is no particular limitation, and the laminate may be a metal-clad laminate formed by disposing a metallic foil on the prepreg upon laminate molding. The wiring board of the present invention is obtained by subjecting the above-mentioned laminate to general circuit processing.

With respect to the substrate, there can be used any substrate such that the substrate is impregnated with the resin composition and they can be heat-cured and unified, and glass woven fabric, glass nonwoven fabric, or aramid nonwoven fabric is preferably used. For example, nonwoven fabric or woven fabric comprised of synthetic fibers, or paper can be used. When the resin composition and the substrate are heat-cured and unified, the resultant resin composition has an increased elastic modulus due to the elastic modulus of the substrate. Hence, the result has a molecular weight between crosslinking sites apparently smaller than that of the insulating resin alone. Therefore, it is preferred that a molecular weight between crosslinking sites is determined from an elastic modulus solely of the resin separated from the substrate. But, when the resin cannot be separated from the substrate, the elastic modulus measured in a state such that the resin is unified with the substrate can be corrected using the formula (4) below. A molecular weight between crosslinking sites determined using the corrected storage modulus and using the formula (1) and formula (2) by making a calculation can be used as the molecular weight between crosslinking sites in the present invention, and, with respect to the Poisson ratio and specific gravity in the formula (2), respective values for the single resin must be used. When these values cannot be actually measured, a Poisson ratio of 0.5 and a specific gravity of 1.2 are applied to the formula to make a calculation.

$$Ea=0.11\times Eb-6.25\times 10^8 \quad \text{Formula (4)}$$

(Ea: corrected storage modulus; Eb: storage modulus measured in a state such that resin is unified with substrate)

When inorganic filler is added to the resin composition, the elastic modulus calculated using the formula (4) must be further corrected using the formula (3) above.

EXAMPLES

Hereinbelow, the present invention will be described in more detail with reference to the following Examples, which should not be construed as limiting the scope of the present invention.

Example 1

An insulating resin varnish having the formulation shown below was prepared. The equivalent of the heat curing agent relative to epoxy was 1.0. The insulating resin varnish was applied to a PET film and dried at 120° C. for 10 minutes so that the resin was in a semicured state to prepare a film with insulating resin having a thickness of 70±5 μm. A semicured resin was removed from the film with insulating resin and obtained in the form of powder. From the powder of semicured resin, a resin plate was prepared in accordance with the following procedure. As a spacer and a release sheet, a fluororesin sheet having formed therein a 50 mm square as a die for resin plate was prepared, and the resin powder was placed in the square, and a copper foil was disposed on both sides of the sheet and cured under press conditions at 175° C. and 2.5 MPa for 90 minutes. Then, the copper foil was etched away, and the resin plate was peeled off the fluororesin sheet to prepare a resin plate having a thickness of 0.2 mm for measurement of thermal expansion coefficient and elastic modulus.

Difunctional naphthalene epoxy resin: HP-4032D: 100 g (trade name; manufactured by Dainippon Ink & Chemicals Incorporated)

Aminotriazine novolak resin: LA-3018: 52.9 g (trade name; manufactured by Dainippon Ink & Chemicals Incorporated)

Curing accelerator: 1-Cyanoethyl-2-phenylimidazole: 2PZ-CN: 0.5 g (trade name; manufactured by Shikoku Corporation)

Solvent: Methyl ethyl ketone: 250 g

Example 2

A resin plate for measurement of thermal expansion coefficient and elastic modulus was obtained in substantially the same manner as in Example 1 except that the epoxy resin was changed to 100 g of a dihydroanthracene epoxy resin: YX-8800 (trade name; manufactured by Japan Epoxy Resins Co., Ltd.), and that the amount of aminotriazine novolak resin LA-3018 as a curing agent was changed from 52.9 g to 39.8 g.

Example 3

A resin plate for measurement of thermal expansion coefficient and elastic modulus was obtained in substantially the same manner as in Example 1 except that the epoxy resin was changed to 100 g of a biphenyl novolak epoxy resin: NC-3000-H (trade name; manufactured by Nippon Kayaku Co., Ltd.), and that the amount of aminotriazine novolak resin LA-3018 as a curing agent was changed to 24.9 g.

Example 4

A resin plate for measurement of thermal expansion coefficient and elastic modulus was obtained in substantially the same manner as in Example 1 except that 187.5 g of silica: SO-G1 (trade name; manufactured by Admatechs Co., Inc.; average particle size: 0.2 to 0.4 μm) was added to the formulation in Example 1.

Example 5

(1) Preparation of Impregnating Resin for Glass Woven Fabric

An impregnating resin varnish for glass woven fabric having the formulation shown below was prepared.

Difunctional naphthalene epoxy resin: HP-4032D: 100 g (trade name; manufactured by Dainippon Ink & Chemicals Incorporated)

Aminotriazine novolak resin: LA-3018: 52.9 g (trade name; manufactured by Dainippon Ink & Chemicals Incorporated)

Curing accelerator: 2PZ-CN: 0.5 g (trade name; manufactured by Shikoku Corporation)

Silica: SO-G1: 187.5 g (trade name; manufactured by Admatechs Co., Inc.; average particle size: 0.2 to 0.4

Solvent: Methyl ethyl ketone: 400 g (2) Preparation of Substrate for Measurement of Thermal Expansion Coefficient Glass woven fabric having a thickness of 0.2 mm (basis weight: 210 g/m$^2$) was impregnated with the impregnating resin varnish for glass woven fabric prepared in item (1) above, and heated at 160° C. for 3 minutes to obtain a semi-icured (B-stage) prepreg. Four sheets of the resultant prepreg were stacked on one another, and on both sides of the stacked prepreg was disposed a copper foil (trade name: F2-WS) having a thickness of 18 μm (Rz: 2.0 μm; Ra: 0.3 μm) as a metallic foil, followed by pressing under conditions at 175° C. and 2.5 MPa for 90 minutes, to prepare a double-sided copper-clad laminate. The copper-clad laminate prepared was immersed in a 150 g/l aqueous solution of ammonium persulfate at 40° C. for 20 minutes to etch the copper foil away, obtaining a substrate for measurement of thermal expansion coefficient and elastic modulus.

Example 6

A resin plate for measurement of thermal expansion coefficient and elastic modulus was obtained in substantially the same manner as in Example 1 except that the epoxy resin was changed to 100 g of a dihydroanthracene epoxy resin: YX-8800 (trade name; manufactured by Japan Epoxy Resins Co., Ltd.) and 65.8 g of a biphenyl novolak epoxy resin: NC-3000-H (trade name; manufactured by Nippon Kayaku Co., Ltd.), that 84.5 g of a cresol novolak resin: KA-1165 (trade name; manufactured by Dainippon Ink & Chemicals Incorporated) was added, and that 1.66 g of a dicyandiamide (manufactured by Kanto Chemical Co., Ltd.), in terms of a dicyandiamide, dissolved in propylene glycol monomethyl ether in an amount of 2% by weight was added.

Example 7

A resin plate for measurement of thermal expansion coefficient and elastic modulus was obtained in substantially the same manner as in Example 1 except that the epoxy resin was changed to 100 g of a dihydroanthracene epoxy resin: YX-8800 (trade name; manufactured by Japan Epoxy Resins Co., Ltd.) and 65.8 g of a biphenyl novolak epoxy resin: NC-3000-H (trade name; manufactured by Nippon Kayaku Co., Ltd.), that 75.1 g of a cresol novolak resin: KA-1165 (trade name; manufactured by Dainippon Ink & Chemicals Incorporated) was added, and that 9.9 g of benzoguanamine (manufactured by Kanto Chemical Co., Ltd.) was added.

Example 8

A resin plate for measurement of thermal expansion coefficient and elastic modulus was obtained in substantially the same manner as in Example 1 except that the epoxy resin was changed to 100 g of a difunctional naphthalene epoxy resin: HP-4032D (trade name; manufactured by Dainippon Ink & Chemicals Incorporated), and that 478 g of a bismaleimide-containing aminotriazine novolak resin: IZ-9872 (trade name; manufactured by Dainippon Ink & Chemicals Incorporated) was added.

Example 9

A resin plate for measurement of thermal expansion coefficient and elastic modulus was obtained in substantially the same manner as in Example 1 except that the epoxy resin was changed to 100 g of a dihydroanthracene epoxy resin: YX-8800 (trade name; manufactured by Japan Epoxy Resins Co., Ltd.) and 44.8 g of a phenolic novolak epoxy resin: N-770 (trade name; manufactured by Dainippon Ink & Chemicals Incorporated), that the amount of LA-3018 was changed to 59.6 g, and that 249.8 g of silica: SO-G1 (trade name; manufactured by Admatechs Co., Inc.; average particle size: 0.2 to 0.4 μm) was further added.

Example 10

A resin plate for measurement of thermal expansion coefficient and elastic modulus was obtained in substantially the same manner as in Example 1 except that the epoxy resin was changed to 100 g of a dihydroanthracene epoxy resin: YX-8800 (trade name; manufactured by Japan Epoxy Resins Co., Ltd.) and 42.6 g of a phenolic novolak epoxy resin: N-740 (trade name; manufactured by Dainippon Ink & Chemicals Incorporated), that the amount of LA-3018 as a curing agent was changed to 59.6 g, and that 247.1 g of silica: SO-G1 (trade name; manufactured by Admatechs Co., Inc.; average particle size: 0.2 to 0.4 μm) was further added.

Example 11

A resin plate for measurement of thermal expansion coefficient and elastic modulus was obtained in substantially the same manner as in Example 1 except that the epoxy resin was changed to 100 g of a dihydroanthracene epoxy resin: YX-8800 (trade name; manufactured by Japan Epoxy Resins Co., Ltd.) and 49.5 g of a bisphenol A epoxy resin: N-865 (trade name; manufactured by Dainippon Ink & Chemicals Incorporated), that the amount of LA-3018 as a curing agent was changed to 59.6 g, and that 255.6 g of silica: SO-G1 (trade name; manufactured by Admatechs Co., Inc.; average particle size: 0.2 to 0.4 μm) was further added.

Example 12

A substrate for measurement of thermal expansion coefficient and elastic modulus was obtained in substantially the same manner as in Example 5 except that the epoxy resin was changed to 100 g of a dihydroanthracene epoxy resin: YX-8800 (trade name; manufactured by Japan Epoxy Resins Co., Ltd.) and 65.8 g of a biphenyl novolak epoxy resin: NC-3000-H (trade name; manufactured by Nippon Kayaku Co., Ltd.), that the curing agent was changed to 84.5 g of a cresol novolak resin: KA-1165 (trade name; manufactured by Dainippon Ink & Chemicals Incorporated) and 1.66 g of a dicyandiamide (manufactured by Kanto Chemical Co., Ltd.), in terms of a dicyandiamide, dissolved in propylene glycol monomethyl ether in an amount of 2% by weight, and that the amount of silica: SO-G1 (trade name; manufactured by Admatechs Co., Inc.; average particle size: 0.2 to 0.4 μm) was changed to 308.0 g.

Comparative Example 1

An insulating resin varnish having the formulation shown below was prepared. The equivalent of the heat curing agent relative to epoxy was 1.0. The insulating resin varnish was applied to a PET film and dried at 120° C. for 10 minutes to prepare a film with insulating resin having a thickness of 70±5 µm. A semicured resin was removed from the film with insulating resin and obtained in the form of powder. From the powder of semicured resin, a resin plate was prepared in accordance with the following procedure. As a spacer and a release sheet, a fluororesin sheet having formed therein a 50 mm square as a die for resin plate was prepared, and the resin powder was placed in the square, and a copper foil was disposed on both sides of the sheet and cured under press conditions at 175° C. and 2.5 MPa for 90 minutes. Then, the copper foil was etched away, and the resin plate was peeled off the fluororesin sheet to prepare a resin plate having a thickness of 0.2 mm for measurement of thermal expansion coefficient and elastic modulus.

Phenolic novolak epoxy resin: N-770: 100 g (trade name; manufactured by Dainippon Ink & Chemicals Incorporated)

Phenolic novolak resin: HP-850: 53.3 g (trade name; manufactured by Hitachi Chemical Co., Ltd.) Dicyandiamide: 0.13 g (trade name; manufactured by Kanto Chemical Co., Ltd.)

Curing accelerator: 2PZ-CN: 0.5 g (trade name; manufactured by Shikoku Corporation)

Solvent: Methyl ethyl ketone: 250 g

Comparative Example 2

A resin plate for measurement of thermal expansion coefficient and elastic modulus was obtained in substantially the same manner as in Comparative Example 1 except that the epoxy resin was changed to 100 g of a tetrafunctional naphthalene epoxy resin: HP-4700 (trade name; manufactured by Dainippon Ink & Chemicals Incorporated), and that the curing agent was changed to 43.4 g of an aminotriazine novolak resin: LA-3018 (trade name; manufactured by Dainippon Ink & Chemicals Incorporated).

Comparative Example 3

Preparation of HP-4032 Reaction Product

Ingredients of formulation 1 shown below were placed in a 1-litter four-necked separable flask equipped with a thermometer, a condenser, and a stirrer to effect a reaction at 100° C. for 2 hours. The resultant reaction mixture was cooled to room temperature (25° C.), and ingredients of formulation 2 shown below were added to the mixture to prepare an insulating resin varnish. The insulating resin varnish was applied to a PET film and dried at 160° C. for 10 minutes to prepare a film with insulating resin having a thickness of 70±5 µm. A semicured resin was removed from the film with insulating resin and obtained in the form of powder. From the powder of semicured resin, a resin plate was prepared in accordance with the following procedure. As a spacer and a release sheet, a fluororesin sheet having formed therein a 50 mm square as a die for resin plate was prepared, and the resin powder was placed in the square, and a copper foil was disposed on both sides of the sheet and cured under press conditions at 175° C. and 2.5 MPa for 90 minutes. Then, the copper foil was etched away, and the resin plate was peeled off the fluororesin sheet to prepare a resin plate having a thickness of 0.2 mm for measurement of thermal expansion coefficient and elastic modulus.

Formulation 1

Difunctional naphthalene epoxy resin: HP-4032D: 83.2 g (trade name; manufactured by Dainippon Ink & Chemicals Incorporated)

Bisphenol A: 69.8 g (reagent grade; manufactured by Kanto Chemical Co., Ltd.)

Curing accelerator: 2PZ-CN: 0.4 g (trade name; manufactured by Shikoku Corporation)

Formulation 2

Difunctional naphthalene epoxy resin: HP-4032D: 100 g (trade name; manufactured by Dainippon Ink & Chemicals Incorporated)

Aminotriazine novolak resin: LA-3018: 52.9 g (trade name; manufactured by Dainippon Ink & Chemicals Incorporated)

Curing accelerator: 2PZ-CN: 0.5 g (trade name; manufactured by Shikoku Corporation)

Solvent: Cyclohexanone: 250 g

Comparative Example 4

A resin plate for measurement of thermal expansion coefficient and elastic modulus was obtained in substantially the same manner as in Comparative Example 1 except that 188.2 g of silica: SO-G1 (trade name; manufactured by Admatechs Co., Inc.; average particle size: 0.2 to 0.4 µm) was further added.

Comparative Example 5

(1) Preparation of Impregnating Resin for Glass Woven Fabric

An impregnating resin varnish for glass woven fabric having the formulation shown below was prepared.

Phenolic novolak epoxy resin: N-770: 100 g (trade name; manufactured by Dainippon Ink & Chemicals Incorporated)

Phenolic novolak resin: HP-850: 53.3 g (trade name; manufactured by Hitachi Chemical Co., Ltd.)

Dicyandiamide: 0.13 g (trade name; manufactured by Kanto Chemical Co., Ltd.)

Curing accelerator: 2PZ-CN: 0.5 g (trade name; manufactured by Shikoku Corporation)

Silica: SO-G1: 188.2 g (trade name; manufactured by Admatechs Co., Inc.; average particle size: 0.2 to 0.4 µm)

Solvent: Methyl ethyl ketone: 400 g (2) Preparation of Substrate for Measurement of Thermal Expansion Coefficient Glass woven fabric having a thickness of 0.2 mm (basis weight: 210 g/m$^2$) was impregnated with the impregnating resin varnish for glass woven fabric prepared in item (1) above, and heated at 160° C. for 3 minutes to obtain a semicured (B-stage) prepreg. Four sheets of the resultant prepreg were stacked on one another, and on both sides of the stacked prepreg was disposed a copper foil (trade name: F2-WS) having a thickness of 18 µm (Rz: 2.0 am; Ra: 0.3 µm), followed by pressing under conditions at 175° C. and 2.5 MPa for 90 minutes, to prepare a double-sided copper-clad laminate. The copper-clad laminate prepared was immersed in a 150 g/l aqueous solution of ammonium persulfate at 40° C.

for 20 minutes to etch the copper foil away, obtaining a substrate for measurement of thermal expansion coefficient and elastic modulus.

Comparative Example 6

A substrate for measurement of thermal expansion coefficient and elastic modulus was obtained in substantially the same manner as in Comparative Example 5 except that the amount of silica SO-G1 was changed to 282.3 g.

Comparative Example 7

Preparation of a sample was conducted in substantially the same manner as in Comparative Example 5 except that the amount of silica SO-G1 was changed to 422.0 g, but the press moldability was too poor to obtain a sample.

Comparative Example 8

Preparation of a sample was conducted in substantially the same manner as in Comparative Example 1 except that the epoxy resin was changed to 100 g of a difunctional naphthalene epoxy resin: HP-4032D (trade name; manufactured by Dainippon Ink & Chemicals Incorporated), and that the curing agent was changed to 83.8 g of bisphenol A (manufactured by Kanto Chemical Co., Ltd.) and dicyandiamide was not added, but the sample was disadvantageously elongated due to the load of the measurement apparatus at a temperature of Tg or higher, making it impossible to measure a storage modulus at a temperature of Tg or higher.

Comparative Example 9

A resin plate for measurement of thermal expansion coefficient and elastic modulus was obtained in substantially the same manner as in Comparative Example 2 except that the curing agent was changed to 58.6 g of triphenolmethane: MEH-7500 (trade name; manufactured by MEIWA PLASTIC INDUSTRIES, LTD.).

Comparative Example 10

Preparation of a sample was conducted in substantially the same manner as in Comparative Example 1 except that the epoxy resin was changed to 100 g of a dihydroanthracene epoxy resin: YX-8800 (trade name; manufactured by Japan Epoxy Resins Co., Ltd.), and that the curing agent was changed to 63.0 g of bisphenol A (manufactured by Kanto Chemical Co., Ltd.), but the sample was disadvantageously elongated due to the load of the measurement apparatus at a temperature of Tg or higher, making it impossible to measure a storage modulus at a temperature of Tg or higher.

Comparative Example 11

A resin plate for measurement of thermal expansion coefficient and elastic modulus was obtained in substantially the same manner as in Comparative Example 1 except that the epoxy resin was changed to 100 g of a naphthalene novolak epoxy resin: NC-7000L (trade name; manufactured by Nippon Kayaku Co., Ltd.), and that the curing agent was changed to 45.5 g of a phenolic novolak resin: HP-850 (trade name; manufactured by Hitachi Chemical Co., Ltd.).

Measurement of Thermal Expansion Coefficient

With respect to each of the resin plates for measurement of thermal expansion coefficient and elastic modulus in Examples 1 to 4 and 6 to 11 and Comparative Examples 1 to 4 and 8 to 11, the copper foil was removed and a 4×20 mm test specimen was cut out, and a thermal expansion coefficient at a temperature of lower than Tg was measured with respect to the test specimen using a TMA tester (TMA-2940), manufactured by TA Instruments, by a tensile method at a temperature elevation rate of 10° C./min. With respect to each of the substrates for measurement of thermal expansion coefficient and elastic modulus in Examples 5 and 12 and Comparative Examples 5 to 7, the copper foil was removed and a 5 mm square test specimen was cut out, and a thermal expansion coefficient at a temperature of lower than Tg was measured with respect to the test specimen using a TMA tester (TMA-2940), manufactured by TA Instruments, by a compression method at a temperature elevation rate of 10° C./min.

Measurement of Storage Modulus

With respect to each of the resin plates for measurement of thermal expansion coefficient and elastic modulus and the substrates for measurement of thermal expansion coefficient and elastic modulus, the copper foil was removed and a 5×30 mm test specimen was cut out, and a storage modulus was measured with respect to the test specimen using a dynamic viscoelasticity measurement apparatus (E-4000, manufactured by UBM Co., Ltd.) under automatic static load conditions at a temperature elevation rate of 5° C./min.

Handling Properties (Dusting) of Impregnated Glass Cloth

The prepreg prepared was cut by means of a cutter and visually observed in respect of dusting.

With respect to the resin plates for measurement of thermal expansion coefficient and elastic modulus prepared in Examples (containing a resin and containing no inorganic filler and no glass cloth), the results of the measurements of storage modulus in the lengthwise direction and thermal expansion coefficient at a temperature of lower than Tg are shown in Tables 1 and 3.

With respect to the substrates for measurement of thermal expansion coefficient and elastic modulus prepared in Examples (containing a resin and inorganic filler and/or glass cloth), the results of the measurements of storage modulus in the plane direction and thermal expansion coefficient at a temperature of lower than Tg are also shown in Tables 1 and 3.

On the other hand, with respect to the resin plates for measurement of thermal expansion coefficient and elastic modulus prepared in Comparative Examples, the results of the measurements of storage modulus in the lengthwise direction and thermal expansion coefficient at a temperature of lower than Tg are shown in Tables 2 and 4.

With respect to the substrates for measurement of thermal expansion coefficient and elastic modulus prepared in Comparative Examples, the results of the measurements of storage modulus in the plane direction and thermal expansion coefficient at a temperature of lower than Tg are also shown in Tables 2 and 4.

In Examples 1 to 3 and 6 to 8 and Comparative Examples 1 to 3 and 8 to 11, the specific gravity of the material was 1.2. In Examples 4 and 9 to 11 and Comparative Example 4, the specific gravity of the material was 1.6. In Examples 5 and 12 and Comparative Examples 5 and 6, the specific gravity of the material was 2.0. In Comparative Example 7, the specific gravity of the material was 2.2. With respect to the correction of the molecular weight between crosslinking sites, the storage modulus was corrected using a storage modulus of 80 GPa for silica, and a molecular weight between crosslinking sites was determined by making a calculation using a specific gravity of 1.2 for the material. A Poisson ratio of 0.5 was used in all the Examples and Comparative Examples.

The resin plates in Examples 1 to 3 and 6 to 8 have a thermal expansion coefficient at a temperature of lower than Tg of 55 to 64 ppm/° C., whereas the resin plates in Comparative Examples 1 to 3 and 8 to 11 have a thermal expansion coefficient at a temperature of lower than Tg of 68 to 87 ppm/° C. From this, it is apparent that the resin plates in the Examples have a thermal expansion coefficient at a temperature of lower than Tg smaller than that of the resin plates in the Comparative Examples by 4 ppm/° C. at the least and by 32 ppm/° C. at the most. In Comparative Examples 8 and 10, each sample was disadvantageously elongated due to the load of the measurement apparatus at a temperature of Tg or higher, making it impossible to measure a storage modulus at a temperature of Tg or higher. In Examples 1 to 3 and 6 to 8, the molecular weight between crosslinking sites falls in the range of from 300 to 1,000 defined in the present invention. By contrast, in Comparative Examples 1 to 3, 9, and 11, the molecular weight between crosslinking sites is 250 or less, and hence the crosslinking density is high and satisfactory interaction between aromatic rings is not exhibited, so that the thermal expansion coefficient cannot be reduced.

In Comparative Example 3 in which to the formulation in Example 1 is added a reaction product using the same epoxy resin as that in Example 1 and the molecular weight between crosslinking sites is 3,860, the thermal expansion coefficient at a temperature of lower than Tg is 68 ppm/° C. From this, it is apparent that, by merely adding an insulating resin having an aromatic ring, the thermal expansion coefficient at a temperature of lower than Tg cannot be reduced utilizing the interaction between aromatic rings, and this result indicates that, for reducing the thermal expansion coefficient utilizing the interaction between aromatic rings, it is essential to control the resin formulation so that the molecular weight between crosslinking sites in the present invention falls in the range of from 300 to 1,000.

In Examples 4 and 9 to 11 and Comparative Example 4, silica is incorporated as inorganic filler. The thermal expansion coefficient at a temperature of lower than Tg in Examples 4 and 9 to 11 is 34 to 36 ppm/° C., wherein that in Comparative Example 4 is 40 ppm/° C. With respect to the corrected molecular weight between crosslinking sites, Example 4 is 458, Example 9 is 320, Example 10 is 564, and Example 11 is 365. By contrast, Comparative Example 4 is 235. From this, it is apparent that, like the insulating resin in Examples 1 to 3, in Examples 4 and 9 to 11, the interaction between aromatic rings reduces the thermal expansion coefficient. Further, it has been found that, even when filler is incorporated, the insulating resin having a molecular weight between crosslinking sites in the range defined in the present invention exhibits a reduced thermal expansion coefficient at a temperature of lower than Tg, as compared to that of a conventional material.

In Example 5 and Comparative Example 5, the resin varnishes in Example 4 and Comparative Example 4 are, respectively, impregnated with glass cloth. The thermal expansion coefficient at a temperature of lower than Tg in Example 5 is 13.5 ppm/° C., whereas that in Comparative Example 5 is 15 ppm/° C. With respect to the molecular weight between crosslinking sites determined using the corrected storage modulus, Example 5 is 458 and Comparative Example 5 is 233.

In Example 12, glass cloth is impregnated with the resin varnish in Example 6 to which silica is added. The thermal expansion coefficient at a temperature of lower than Tg in Example 12 is 12.5 ppm/° C. The molecular weight between crosslinking sites determined using the corrected storage modulus is 314.

In Comparative Examples 6 and 7, the amount of the silica contained in the resin varnish in Comparative Example 5 is increased. In Comparative Example 6, the thermal expansion coefficient at a temperature of lower than Tg is 13.5 ppm/° C., but the handling properties of the impregnated glass cloth are poor, that is, marked dusting is caused. In Comparative Example 7, the press moldability was too poor to obtain a sample. In Comparative Example 6, the molecular weight between crosslinking sites determined using the corrected storage modulus was 218. From the above, it is apparent that, for reducing the thermal expansion coefficient utilizing the interaction between aromatic rings, it is essential to control the resin formulation so that the insulating resin has a molecular weight between crosslinking sites in the range of from 300 to 1,000.

When the thermal expansion coefficient is reduced to the thermal expansion coefficient at a temperature of lower than Tg in Example 12 by a conventional method in which the amount of filler is increased, a failure of the press molding occurs, but the press molding is achieved in Example 12, which indicates the effect of the present invention.

In the Tables below, the amount of each component is indicated in a unit of gram (g).

TABLE 1

| Classification | Material | Trade name | Example 1 | Example 2 | Example 3 | Example 4 | Example 5 |
|---|---|---|---|---|---|---|---|
| Epoxy resin | Naphthalene epoxy resin | HP-4032D | 100 | | | 100 | 100 |
| | Dihydroanthracene epoxy resin | YX-8800 | | 100 | | | |
| | Biphenyl novolak epoxy resin | NC-3000-H | | | 100 | | |
| Curing agent | Aminotriazine novolak resin | LA3018 | 52.9 | 39.8 | 24.9 | 52.9 | 52.9 |
| Curing | 2PZ-CN | 2PZ-CN | 0.5 | 0.5 | 0.5 | 0.5 | 0.5 |
| Inorganic filler | Silica | SO-G1 | | | | 187.5 | 187.5 |
| Glass cloth | | | Not used | Not used | Not used | Not used | Used |
| Thermal expansion coefficient | Resin only | | 55 ppm/° C. | 58 ppm/° C. | 60 ppm/° C. | — | — |
| | Resin + Silica | | — | — | — | 36 ppm/° C. | — |
| | Resin + Silica + Glass cloth | | — | — | — | — | 13.5 ppm/° C. |
| Storage modulus (250° C.) | | | 18 MPa | 9.3 MPa | 19 MPa | 100 MPa | 6600 MPa |
| Molecular weight between crosslinking sites | | | 452 | 716 | 439 | 308 | 175 |
| Corrected molecular weight between crosslinking sites | | | — | — | — | 458 | 458 |

TABLE 1-continued

| Classification | Material | Trade name | Example 1 | Example 2 | Example 3 | Example 4 | Example 5 |
|---|---|---|---|---|---|---|---|
| Handling properties of impregnated glass cloth (Dusting) | | | — | — | — | — | Slight |
| Press moldability | | | — | — | — | — | Excellent |

TABLE 2

| Classification | Material | Trade name | Comparative Example 1 | Comparative Example 2 | Comparative Example 3 | Comparative Example 4 |
|---|---|---|---|---|---|---|
| Epoxy resin | Phenolic novolak epoxy resin | N-770 | 100 | | | 100 |
| | Naphthalene epoxy resin | HP-4700 | | 100 | | |
| | | HP-4032D | | | 100 | |
| | HP-4032 Reaction product | — | | | | 153.4 |
| Curing agent | Phenolic novolak resin | HP-850 | 53.3 | | | 53.3 |
| | Dicyandiamide | — | | 0.13 | | 0.13 |
| | Aminotriazine novolak resin | LA3018- | | | 43.4 | 52.9 |
| Curing accelerator | 2PZ-CN | 2PZ-CN | 0.5 | 0.5 | 0.5 | 0.5 |
| Inorganic filler | Silica | SO-G1 | | | | 188.2 |
| Glass cloth | | | Not used | Not used | Not used | Not used |
| Thermal expansion coefficient | Resin only | | 75 ppm/° C. | 72 ppm/° C. | 68 ppm/° C. | — |
| | Resin + Silica | | — | — | — | 40 ppm/° C. |
| | Resin + Silica + Glass cloth | | — | — | — | — |
| Storage modulus (250° C.) | | | 120 MPa | 88 MPa | 3.7 MPa | 460 MPa |
| Molecular weight between crosslinking sites | | | 219 | 240 | 3860 | 214 |
| Corrected molecular weight between crosslinking sites | | | — | — | — | 235 |
| Handling properties of impregnated glass cloth (Dusting) | | | — | — | — | — |
| Press moldability | | | — | — | — | — |

| Classification | Material | Trade name | Comparative Example 5 | Comparative Example 6 | Comparative Example 7 |
|---|---|---|---|---|---|
| Epoxy resin | Phenolic novolak epoxy resin | N-770 | 100 | 100 | 100 |
| | Naphthalene epoxy resin | HP-4700 | | | |
| | | HP-4032D | | | |
| | HP-4032 Reaction product | — | | | |
| Curing agent | Phenolic novolak resin | HP-850 | 53.3 | 53.3 | 53.3 |
| | Dicyandiamide | | 0.13 | 0.13 | 0.13 |
| | Aminotriazine novolak resin | LA3018- | | | |
| Curing accelerator | 2PZ-CN | 2PZ-CN | 0.5 | 0.5 | 0.5 |
| Inorganic filler | Silica | SO-G1 | 188.2 | 282.3 | 422.0 |
| Glass cloth | | | Used | Used | Used |
| Thermal expansion coefficient | Resin only | | — | — | Sample cannot be prepared, Measurement impossible |
| | Resin + Silica | | — | — | |
| | Resin + Silica + Glass cloth | | 15 ppm/° C. | 13.5 ppm/° C. | |
| Storage modulus (250° C.) | | | 10000 MPa | 12000 MPa | |
| Molecular weight between crosslinking sites | | | 166 | 163 | |
| Corrected molecular weight between crosslinking sites | | | 233 | 218 | |
| Handling properties of impregnated glass cloth (Dusting) | | | Slight | Marked | Marked |
| Press moldability | | | Excellent | Excellent | Poor |

TABLE 3

| Classification | Material | Trade name | Example 6 | Example 7 | Example 8 | Example 9 |
|---|---|---|---|---|---|---|
| Epoxy resin | Dihydroanthracene epoxy resin | YX-8800 | 100 | 100 | | 100 |
| | Phenolic novolak epoxy resin | N-770 | | | | 44.8 |
| | | N-740 | | | | |
| | Naphthalene epoxy resin | HP-4032D | | | 100 | |
| | Biphenyl novolak epoxy resin | NC-3000-H | 65.8 | 65.8 | | |
| | Cresol novolak epoxy resin | N-865 | | | | |
| Curing agent | Aminotriazine novolak resin | LA3018 | | | | 59.6 |
| | Bismaleimide-containing aminotriazine novolak resin | IZ-9872 | | | 478 | |

TABLE 3-continued

| | | | | | | |
|---|---|---|---|---|---|---|
| | Cresol novolak resin | KA-1165 | 84.5 | 75.1 | | |
| | Dicyandiamide | — | | 1.66 | | |
| | Benzoguanamine | — | | 9.9 | | |
| Curing | 2PZ-CN | 2PZ-CN | 0.5 | 0.5 | 0.5 | 0.5 |
| Inorganic filler | Silica | SO-G1 | | | | 249.8 |
| Glass cloth | | | Not used | Not used | Not used | Not used |
| Thermal | Resin only | | 64 ppm/° C. | 63 ppm/° C. | 57 ppm/° C. | — |
| expansion | Resin + Silica | | — | — | — | 34 ppm/° C. |
| coefficient | Resin + Silica + Glass cloth | | — | — | — | — |
| Storage modulus (250° C.) | | | 36 MPa | 36 MPa | 14 MPa | 120 MPa |
| Molecular weight between crosslinking sites | | | 326 | 326 | 526 | 293 |
| Corrected molecular weight between crosslinking sites | | | — | — | — | 320 |
| Handling properties of impregnated glass cloth (Dusting) | | | — | — | — | — |
| Press moldability | | | — | — | — | — |

| Classification | Material | Trade name | Example 10 | Example 11 | Example 12 |
|---|---|---|---|---|---|
| Epoxy resin | Dihydroanthracene epoxy resin | YX-8800 | 100 | 100 | 100 |
| | Phenolic novolak epoxy resin | N-770 | | | |
| | | N-740 | 42.6 | | |
| | Naphthalene epoxy resin | HP-4032D | | | |
| | Biphenyl novolak epoxy resin | NC-3000-H | | | 65.8 |
| | Cresol novolak epoxy resin | N-865 | | 49.5 | |
| Curing agent | Aminotriazine novolak resin | LA3018 | 59.6 | 59.6 | |
| | Bismaleimide-containing aminotriazine novolak resin | IZ-9872 | | | |
| | Cresol novolak resin | KA-1165 | | | 84.5 |
| | Dicyandiamide | — | | | 1.66 |
| | Benzoguanamine | — | | | |
| Curing | 2PZ-CN | 2PZ-CN | 0.5 | 0.5 | 0.5 |
| Inorganic filler | Silica | SO-G1 | 247.1 | 255.6 | 308.0 |
| Glass cloth | | | Not used | Not used | Used |
| Thermal | Resin only | | — | — | — |
| expansion | Resin + Silica | | 34 ppm/° C. | 35 ppm/° C. | — |
| coefficient | Resin + Silica + Glass cloth | | — | — | 12.5 ppm/° C. |
| Storage modulus (250° C.) | | | 95 MPa | 110 MPa | 6600 MPa |
| Molecular weight between crosslinking sites | | | 312 | 300 | 175 |
| Corrected molecular weight between crosslinking sites | | | 564 | 365 | 314 |
| Handling properties of impregnated glass cloth (Dusting) | | | — | — | Slight |
| Press moldability | | | — | — | Excellent |

TABLE 4

| Classification | Material | Trade name | Comparative Example 8 | Comparative Example 9 | Comparative Example 10 | Comparative Example 11 |
|---|---|---|---|---|---|---|
| Epoxy resin | Naphthalene epoxy resin | HP-4032D | 100 | | | |
| | | HP-4700 | | 100 | | |
| | Dihydroanthracene epoxy resin | YX-8800 | | | 100 | |
| | Naphthalene novolak epoxy | NC-7000L | | | | 100 |
| Curing agent | Triphenolmethane | MEH-7500 | | 58.6 | | |
| | Bisphenol A | — | 83.8 | | 63.0 | |
| | Phenolic novolak resin | HP-850 | | | | 45.5 |
| Curing accelerator | 2PZ-CN | 2PZ-CN | 0.5 | 0.5 | 0.5 | 0.5 |
| Thermal expansion coefficient | Resin only | | 80 ppm/° C. | 87 ppm/° C. | 75 ppm/° C. | 73 ppm/° C. |
| | Resin + Silica | | Storage modulus measurement impossible | | Storage modulus measurement impossible | |
| | Resin + Silica + Glass cloth | | | | | |
| Storage modulus (250° C.) | | | | 77 MPa | | 83 MPa |
| Molecular weight between crosslinking sites | | | | 250 | | 244 |

Structures of the resins used in Examples of the present invention and others are shown below.

TABLE 5
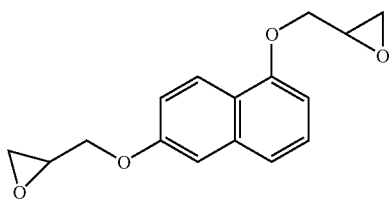 [SMILES: c1cc(OCC2CO2)c2ccc(OCC3CO3)cc2c1]
HP-4032D
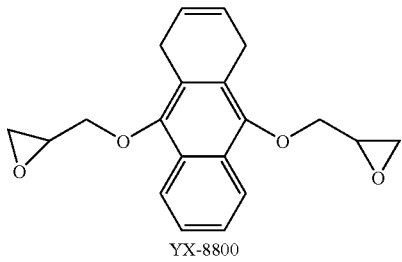
YX-8800
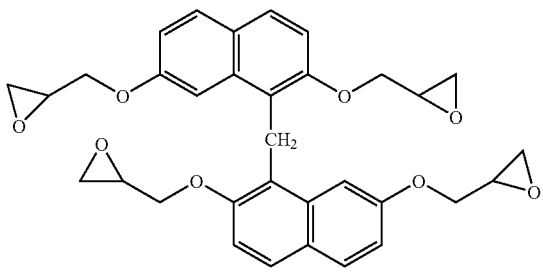 [SMILES: c1cc2ccc(OCC3CO3)c(Cc3c(OCC4CO4)ccc4ccc(OCC5CO5)cc34)c2cc1OCC1CO1]
HP-4700
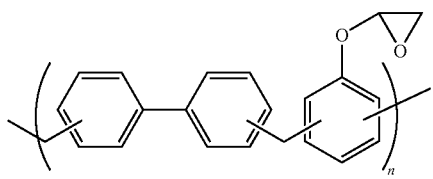
NC-3000-H
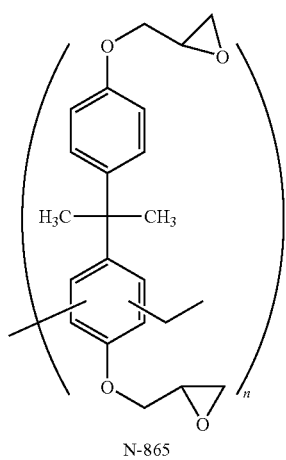
N-865

TABLE 5-continued
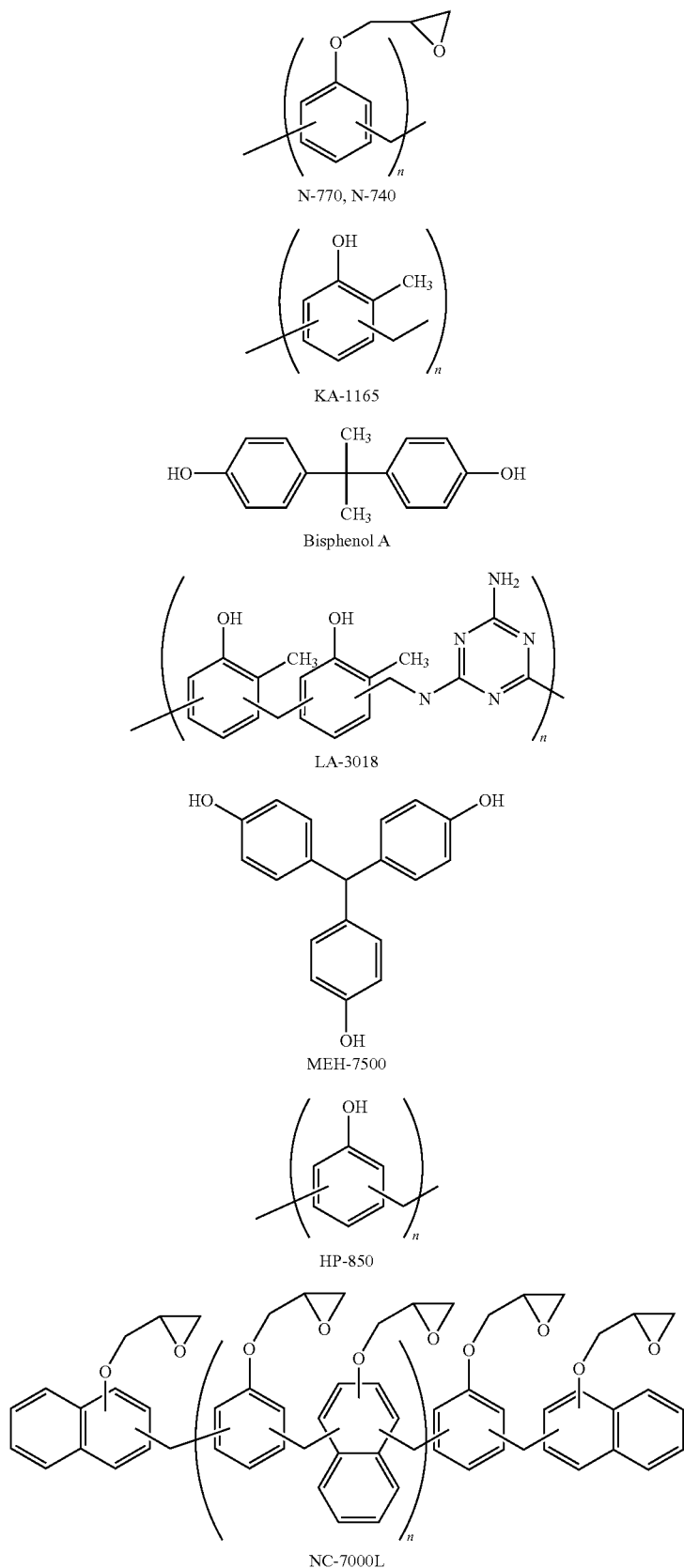

TABLE 5-continued

| Material | Epoxy equivalent (Hydroxyl equivalent) | Specific gravity | Substituent |
|---|---|---|---|
| YX-8800 | 181 | — | Epoxy group |
| HP-4032 | 136 | — | Epoxy group |
| HP-4700 | 162 | — | |
| NC-3000-H | 289 | — | Epoxy group |
| N-865 | 209 | — | Epoxy group |
| N-770 | 190 | 1.1 | Epoxy group |
| N-740 | 180 | 1.1 | Epoxy group |
| NC-7000L | 294 | — | Epoxy group |
| KA-1165 | 119 | 1.2 | Hydroxy group |
| LA-3018 | 151 | 1.1 | Hydroxyl group, Amino group |
| MEH-7500 | 97 | — | Hydroxyl group |
| Bisphenol A | 114 | 1.2 | Hydroxyl group |
| HP-850 | 106 | — | Hydroxyl group |

In the present invention, by controlling the resin formulation of the insulating resin having an aromatic ring so that the insulating resin has a molecular weight between crosslinking sites in the range of from 300 to 1,000, a resin composition having a low thermal expansion coefficient can be obtained.

INDUSTRIAL APPLICABILITY

There can be provided, without increasing the crosslinking density, a resin composition which is advantageous not only in that the resin composition can be produced at low cost, but also in that it is unlikely to thermally expand, a prepreg, a laminate, and a wiring board.

The invention claimed is:

1. A laminate obtained by subjecting a prepreg to laminate molding, wherein the prepreg is obtained by applying a resin composition, for use in production of the laminate, to a substrate so that the substrate is impregnated with the resin composition, and then drying them, wherein the resin composition comprises:

(a) a biphenyl novolak epoxy resin represented by the following general formula (1):

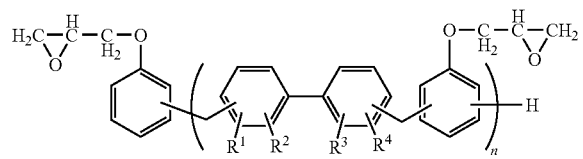

General formula (1)

wherein each of $R^1$ to $R^4$ independently represents a $C_mH_{2m+1}$ group wherein m represents 0 or an integer of 1 or more, and n represents an integer of 1 or more, (b) a dihydroanthracene epoxy resin represented by the following general formula (3):

General formula (3)

wherein $R^9$ each occurrence independently represents a $C_tH_{2t+1}$ group, wherein t represents 0 or an integer of 1 or more, r represents an integer of 0 to 4, $R^{10}$ each occurrence independently represents a $C_uH_{2u+1}$ group, wherein u represents 0 or an integer of 1 or more, and s represents an integer of 0 to 6, and (c) a curing agent, and the resin composition has a molecular weight between crosslinking sites of 300 to 1,000 after curing of the resin composition, as determined from an elastic shear modulus measured at a temperature of Tg or higher.

2. The laminate according to claim 1, wherein the substrate is glass woven fabric, glass nonwoven fabric, or aramid nonwoven fabric.

3. A wiring board obtained by subjecting a metallic foil disposed on one side or both sides of the laminate according to claim 1 to circuit processing.

4. The laminate according to claim 1, wherein said curing agent is at least one member selected from the group consisting of a cresol novolak resin and an aminotriazine novolak resin.

5. The laminate according to claim 4, wherein said molecular weight between crosslinking sites is 326 to 1,000.

6. The laminate according to claim 1, wherein said molecular weight between crosslinking sites is 326 to 1,000.

7. The laminate according to claim 4, wherein the substrate is glass woven fabric, glass nonwoven fabric, or aramid nonwoven fabric.

8. The laminate according to claim 4, wherein said molecular weight between crosslinking sites is 716 to 1,000.

9. The laminate according to claim 1, wherein said molecular weight between crosslinking sites is 716 to 1,000.

10. The laminate according to claim 4, wherein said molecular weight between crosslinking sites is 526 to 1,000.

11. The laminate according to claim 1, wherein said molecular weight between crosslinking sites is 526 to 1,000.

* * * * *